United States Patent
Miyanari et al.

(10) Patent No.: US 7,268,061 B2
(45) Date of Patent: Sep. 11, 2007

(54) SUBSTRATE ATTACHING METHOD

(75) Inventors: Atsushi Miyanari, Kanagawa (JP); Kosuke Doi, Kanagawa (JP); Ken Miyagi, Kanagawa (JP); Yoshihiro Inao, Kanagawa (JP); Koichi Misumi, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 299 days.

(21) Appl. No.: 11/001,575

(22) Filed: Dec. 1, 2004

(65) Prior Publication Data

US 2005/0170612 A1     Aug. 4, 2005

(30) Foreign Application Priority Data

Dec. 1, 2003  (JP) ............................. 2003-402200
Nov. 29, 2004 (JP) ............................. 2004-343477

(51) Int. Cl.
*H01L 21/20* (2006.01)
(52) U.S. Cl. ...................... 438/464; 438/459; 438/460; 428/343
(58) Field of Classification Search ............... 438/464, 438/459, 460; 428/343
See application file for complete search history.

(56) References Cited

U.S. PATENT DOCUMENTS 6,404,643 B1 *   6/2002  Chung ........................ 361/737
6,886,246 B2 *   5/2005  Chung ........................ 29/832
2002/0124392 A1 * 9/2002  Chung ........................ 29/739

FOREIGN PATENT DOCUMENTS

| JP | 2001-077304 | 3/2001 |
| JP | 2002-203821 | 7/2002 |
| JP | 2002-270676 | 9/2002 |

* cited by examiner

*Primary Examiner*—Laura M. Schillinger
(74) *Attorney, Agent, or Firm*—Carrier, Blackman & Assoc. P.C.; Joseph P. Carrier; William D. Blackman

(57) ABSTRACT

A method for attaching a substrate such as a semiconductor wafer in which cracking or chipping can be prevented when the substrate is thinned involves applying adhesive liquid onto a circuit (element)-formed surface of a semiconductor wafer. The adhesive liquid undergoes preliminary drying, so that its flowability is reduced and it can keep its shape as an adhesive layer. For the preliminary drying, heating is conducted for 5 minutes at a temperature of 80° C. by using an oven. The thickness of the adhesive layer is determined based on the irregularities of the circuit which has been formed on the surface of the semiconductor wafer. Next, a supporting plate is attached to the semiconductor wafer on which the adhesive layer of a desired thickness has been formed.

11 Claims, 4 Drawing Sheets

SUBSTRATE ATTACHING METHOD

BACKGROUND OF THE INVENTION

1. Field of the Invention

The present invention relates to a method for attaching a substrate such as a semiconductor wafer to a supporting plate when the substrate is thinned by grinding.

2. Description of the Prior Art

There has been a need of making IC cards for cell phones thinner, smaller, and lighter. In order to satisfy this need, a semiconductor chip to be incorporated therein must be thin. Although the thickness of a wafer which forms a semiconductor chip is 125-150 µm at present, it is expected that the thickness of a semiconductor wafer must be 25-50 µm for a next generation chip.

A conventional method for thinning a semiconductor wafer is shown in FIG. 6. Specifically, a protecting tape is attached to a surface (A-surface) of a semiconductor wafer on which a circuit (element) has been formed. The wafer is turned over, and the rear surface (B-surface) of the semiconductor wafer is ground by a grinder so as to make the wafer thin. The rear surface of the semiconductor wafer which has been thinned is fixed onto a dicing tape retained by a dicing frame, and the protecting tape covering the surface (A-surface) of the semiconductor wafer on which a circuit (element) has been formed is stripped in this state. Next, the wafer is cut into each chip by a dicing device.

The above-mentioned method has been disclosed in Document 1. According to Document 1, the protecting tape having heat resistance is stripped by using a strong adhesive tape which is bonded to one end of the protecting tape.

Document 2 has disclosed that a protecting base obtained by immersing ladder-type silicone oligomer in an aluminum nitride—boron nitride porous sintered material is used instead of a protecting tape, and the protecting base and a semiconductor wafer are bonded together by using a thermoplastic film.

Document 3 has disclosed that a protecting base is made of a material having the same thermal expansion coefficient as a semiconductor wafer such as alumina, aluminum nitride, boron nitride, or silicon carbide, and a thermoplastic resin such as polyimide is used as an adhesive for bonding the protecting base and the semiconductor wafer together. As a method for applying the adhesive, Document 3 has proposed a method in which the adhesive is formed into a film having a thickness of 10-100 µm, or an adhesive resin solution is applied by spin coating and dried so as to form a film having a thickness of 20 µm or less.

[Document 1] Japanese Patent Application Publication No. 2002-270676, paragraph 0035

[Document 2] Japanese Patent Application Publication No. 2002-203821, paragraph 0018

[Document 3] Japanese Patent Application Publication No. 2001-77304, paragraphs 0010 and 0017

In the case of using the protecting tape as disclosed in Document 1, cracking or chipping of the semiconductor wafer easily occur when the tape is stripped. Also, the protecting tape is not sufficient to support the thinned semiconductor wafer. Consequently, transfer needs to be conducted by manpower, and automation is impossible.

In the techniques of Documents 2 and 3, handling or transfer can be automated by using the protecting base (supporting plate) which is made of alumina, aluminum nitride, boron nitride, or silicon carbide instead of a protecting tape. However, since a thermoplastic film which has been dried is used as an adhesive means for bonding the protecting base and the semiconductor wafer together, a heating step is required for softening the thermoplastic film. Also, since non-uniformity of the adhesion strength locally occurs in the case of using a film-shaped adhesive, there are drawbacks that the adhesive unpreferably strips at the time of grinding, or some areas of the adhesive won't strip at the time of dicing.

SUMMARY OF THE INVENTION

According to the present invention, there is provided a substrate attaching method comprising the steps of applying an adhesive liquid onto a circuit-formed surface of a substrate, conducting preliminary drying to the adhesive liquid so as to allow the adhesive liquid to maintain its shape as an adhesive layer, pushing a supporting plate onto the adhesive layer to unite the supporting plate and the adhesive layer, and further drying to the adhesive layer at the same time as the pushing step or after the pushing step.

By conducting preliminary drying, it is possible to easily control the thickness of the adhesive layer. In order to obtain a necessary thickness, the applying step and the preliminary drying step may be repeated a plurality of times.

As the adhesive, it is preferable to employ a water non-soluble macromolecular compound because water is used at the time of grinding. It is also preferable that the softening point of the adhesive is high because there is a high-temperature treatment step such as attachment of a DAF (Die Attach Film). Accordingly, preferable examples include a solution which is obtained by dissolving a novolac resin, an epoxy resin, an amide resin, a silicone resin, an acrylic resin, a urethane resin, polystyrene, polyvinyl ether, polyvinyl acetate, a modification of one or more these, or a combination of two or more of these in a solvent. Among these, an acrylic resin is preferable because it has heat resistance with respect to 200° C. or more, it hardly generates gas, and cracks do not easily occur. A novolac resin is also preferable. Although a novolac resin is inferior to an acrylic resin in terms of the heat resistance, the generation amount of gas, and the crack occurrence, a novolac resin does not cause a scum, and stripping after bonding is easy due to the high softening point. In this case, a plasticizer may be mixed so as to prevent cracks from occurring at the time of film-forming.

In the case of the above-mentioned adhesive, the temperature of the preliminary drying step can be 200° C. or less (40–200° C.), and the temperature of the further drying step can be 300° C. or less (40–300° C.).

As the solvent, it is preferable to employ a solvent in which the above-mentioned materials can be dissolved. It is also preferable that the solvent can be applied uniformly onto a wafer. Examples include ketones such as acetone, methylethylketone, cyclohexanone, methylisoamylketone, or 2-heptanone; polyhydric alcohols and derivatives thereof such as ethylene glycol, propylene glycol, diethylene glycol, ethylene glycol monoacetate, propylene glycol monoacetate, or diethylene glycol monoacetate, or monomethyl ether, monoethyl ether, monopropyl ether, monobutyl ether or monophenyl ether thereof; cyclic ethers such as dioxane; esters such as ethyl lactate, methyl acetate, ethyl acetate, butyl acetate, methyl pyruvate, ethyl pyruvate, methoxy methyl propionate, or ethoxy ethyl propionate; and aromatic hydrocarbons such as benzene, toluene, or xylene. These may be used alone, or two or more kinds may be used in combination. In particular, polyhydric alcohols and derivatives thereof such as ethylene glycol, propylene glycol, diethylene glycol, ethylene glycol monoacetate, propylene glycol monoacetate, or diethylene glycol monoacetate, or monomethyl ether, monoethyl ether, monopropyl ether, monobutyl ether or monophenyl ether thereof are preferable. An additive may be added thereto so as to improve the uniformity of a film thickness.

As a stripping liquid for removing the adhesive, it is possible to use monovalent alcohols such as methanol, ethanol, propanol, isopropanol, or butanol; cyclic lactones such as γ-butyrolactone; ethers such as diethyl ether or anisole; dimethylformaldehyde; or dimethylacetaldehyde. In particular, methanol is preferable because it can be handled in comparative safety.

The supporting plate preferably has a number of penetrating holes in the thickness direction. With this structure, part of the adhesive can enter the penetrating holes, so that the bonding can be strengthened. In addition, alcohol can be supplied through the penetrating holes at the time of stripping.

When the adhesive liquid is applied onto the circuit-formed surface of the substrate by a spin coater, a projection referred to as a bead portion is often formed in the periphery. In this instance, it is preferable to remove the bead portion by a solvent before the adhesive liquid undergoes preliminary drying.

DETAILED DESCRIPTION OF THE PREFERRED EMBODIMENTS

Figure 1:
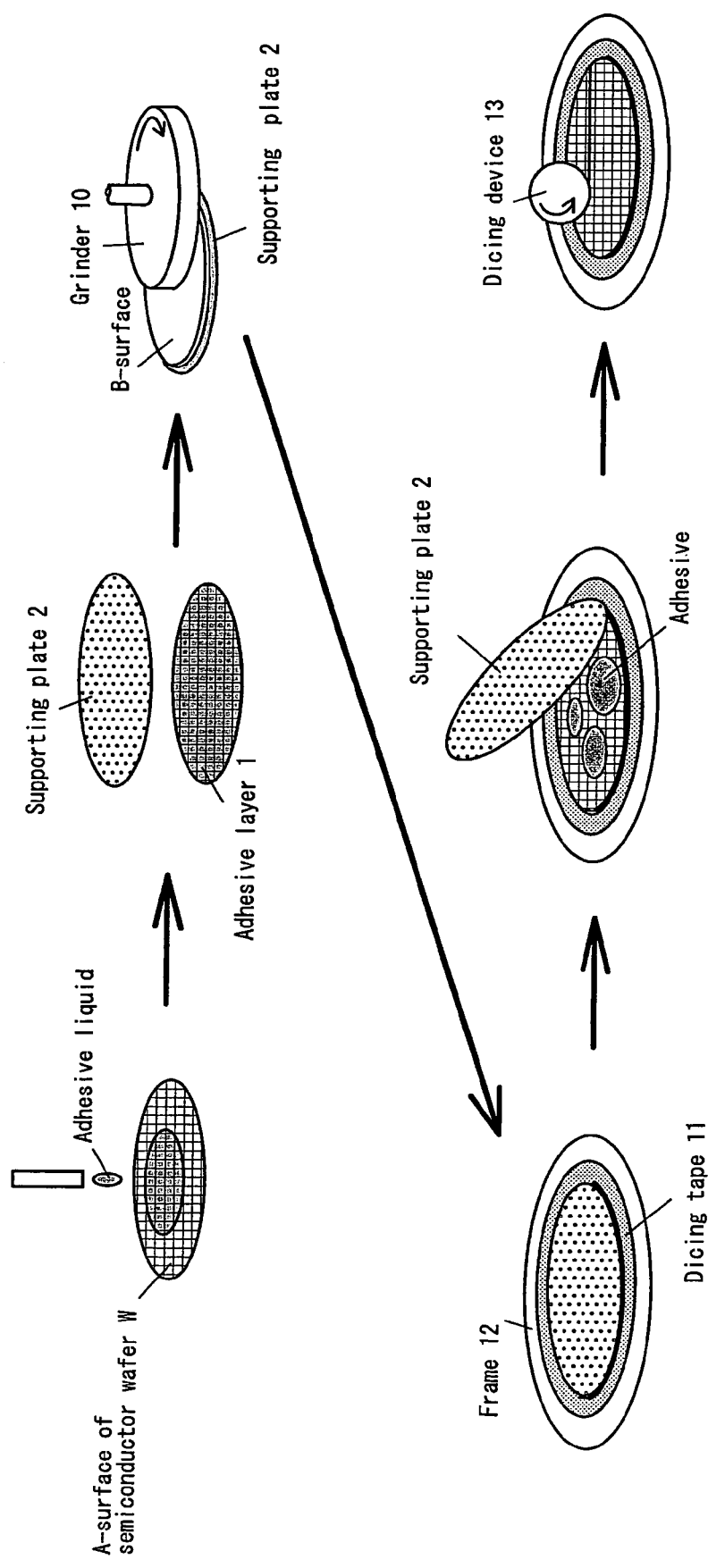
FIG. 1 is a view showing processes for thinning a semiconductor wafer in which an attaching method according to the present invention is incorporated.

Embodiments of the present invention will be described below with reference to the attached drawings. FIG. 1 is a view showing processes for thinning a semiconductor wafer in which an attaching method according to the present invention is incorporated. First, an adhesive liquid is applied onto a circuit(element)-formed surface of a semiconductor wafer W. The application is conducted by using a spinner or the like. The material for the adhesive liquid is an acrylic resin or a novolac-type phenol resin.

Next, the adhesive liquid undergoes preliminary drying, so that its flowability is reduced and it can keep its shape as an adhesive layer 1. For the preliminary drying, heating is conducted for 5 minutes at a temperature of 80° C. by using an oven. The thickness of the adhesive layer 1 is determined based on the irregularities of the circuit which has been formed on the surface of the semiconductor wafer W. If a sufficient thickness is not obtained by one application, application and preliminary drying are repeated a plurality of times. In this instance, the drying degree is adjusted to be higher with respect to preliminary drying for the adhesive layers other than the top layer, so that the flowability of the adhesive layers other than the top layer can be reduced.

Figure 2:
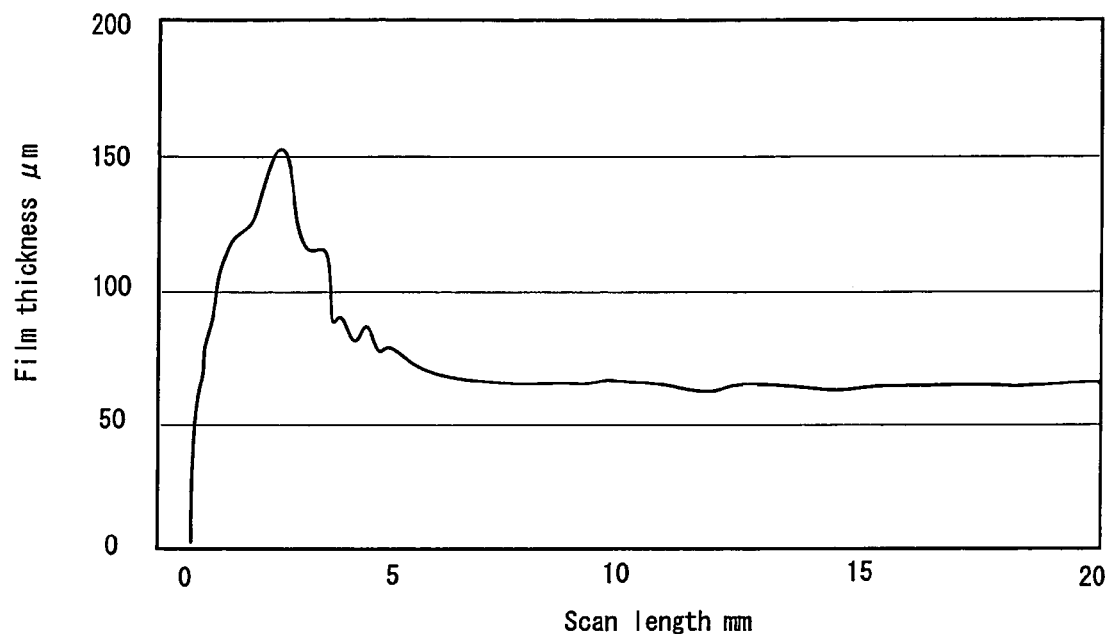
FIG. 2 is a graph showing a projection of an adhesive formed in the edge portion of a semiconductor wafer after preliminary drying.

When a spinner is used for applying the adhesive liquid, a projection is formed in the edge portion of the semiconductor wafer W as shown in FIG. 2. This projection may be flattened in a subsequent press process, or may be removed by using a treatment liquid.

Figure 3:
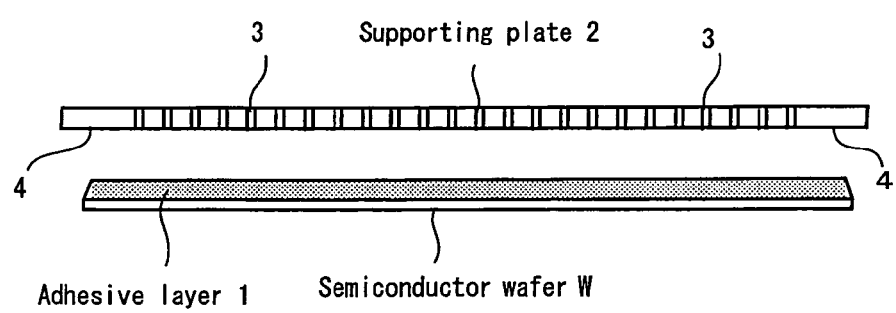
FIG. 3 is a cross-sectional view of a supporting plate.

Next, a supporting plate 2 is attached to the semiconductor wafer W on which the adhesive layer 1 of a desired thickness has been formed. As shown in FIG. 3, the diameter of the supporting plate 2 is slightly larger than that of the semiconductor wafer W. Also, the supporting plate 2 is made of an alloy of iron and nickel (36 Invar in which nickel is 36%) having a thickness of 0.5 mm, and penetrating holes 3 of 0.5 diameter mm are formed at a pitch of 0.7 mm in the supporting plate 2. The outer peripheral portion of the supporting plate 2 is a flat portion 4 in which no penetrating hole is formed.

Figure 4:
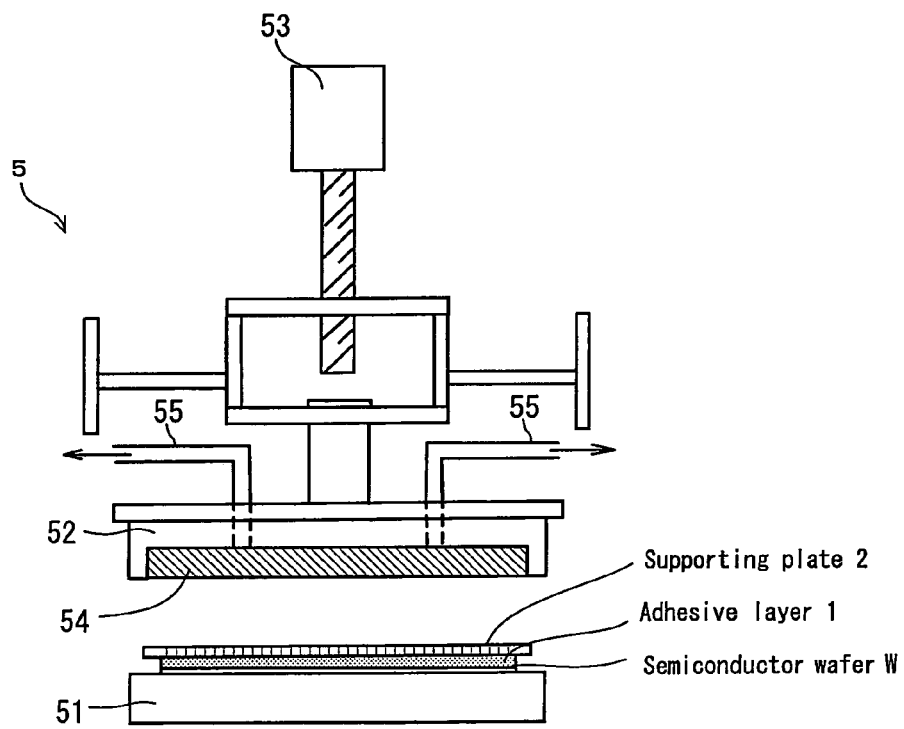
FIG. 4 is a schematic view of an attaching apparatus.

The above-mentioned supporting plate 2 is laid onto the adhesive layer 1 which has been formed on the semiconductor wafer W, and then attached by using an attaching apparatus shown in FIG. 4.

The attaching apparatus 5 comprises a bottom plate 51 and a top plate 52 which is positioned above the bottom plate 51. The top plate 52 is lifted and lowered by driving a motor 53. A sintered plate 54 of ceramic is fixed to the lower surface of the top plate 52, and an exhaust pipe 55 is connected to the sintered plate 54.

In operation, the semiconductor wafer W and the supporting plate 2 are set on the bottom plate 51 in a state where the semiconductor wafer W is positioned below and the supporting plate 2 is positioned above. The motor 53 is driven so as to lower the top plate 52, and the sintered plate 54 is pushed onto the supporting plate 2. At this time, heating (200° C. or less) may be performed simultaneously, so that the solvent of the adhesive layer 1 can be removed via the sintered plate 54 and the exhaust pipe 55.

Next, the semiconductor wafer W and the supporting plate 2 which have been united with respect to each other are taken from the attaching apparatus 5. The rear surface (B-surface) of the semiconductor wafer W is ground by a grinder 10, so that the semiconductor wafer W is thinned. Incidentally, water is supplied to the rear surface of the semiconductor wafer W in order to control friction heat generated between the grinder 10 and the semiconductor wafer W while grinding. Since a non-soluble material, which is not dissolved into water but dissolved into alcohol, is selected as the adhesive, it is possible to prevent the supporting plate 2 from stripping from the semiconductor wafer W at the time of grinding.

A circuit is formed on the rear surface (B-surface) of the semiconductor wafer W if needed, and thereafter the rear surface is fixed onto a dicing tape 11. The dicing tape 11 has an adhesive ability, and also is retained by a dicing frame 12.

Figure 5:
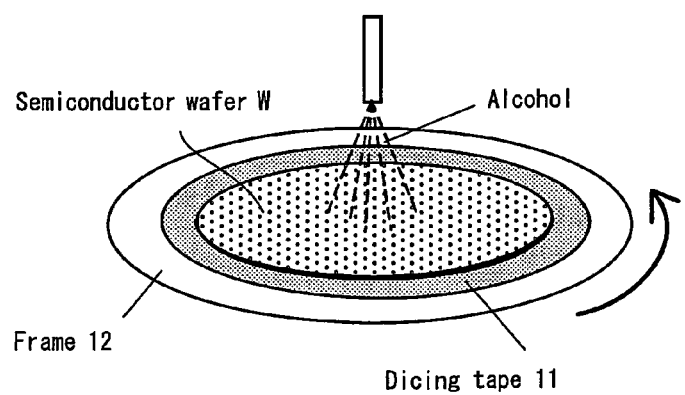
FIG. 5 is a view showing a state where alcohol is supplied from above a supporting plate.
Figure 6:
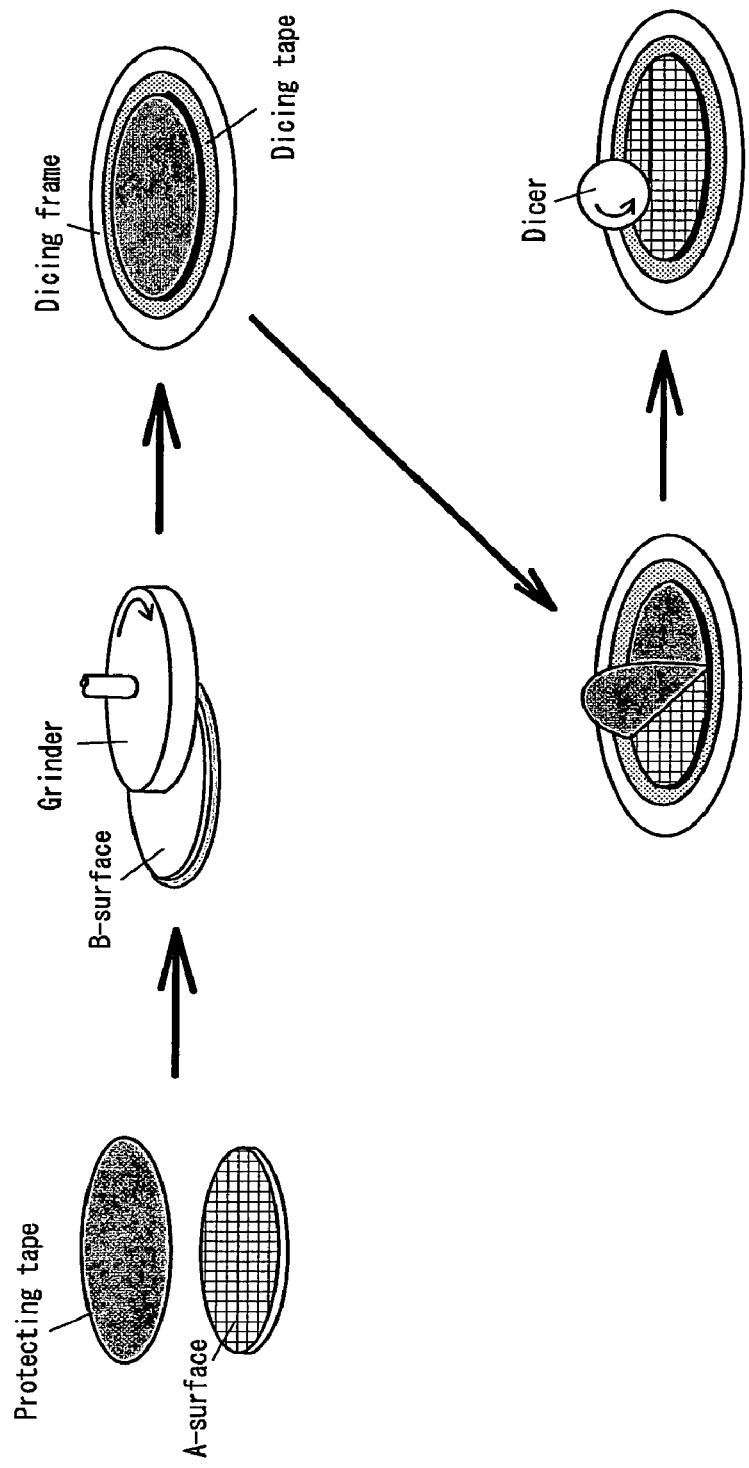
FIG. 6 is a view showing processes for thinning a semiconductor wafer according to a conventional method.

Next, as shown in FIG. 5, alcohol (preferably, low molecular alcohol) is poured from above the supporting plate 2, and thereby the adhesive layer 1 is dissolved and removed. In this instance, by spinning the frame 12 with a spinner which is not shown in the drawing, the alcohol can be spread over the whole surface of the adhesive layer 1 in a short period of time.

Next, the supporting plate 2 is removed, and thereafter the semiconductor wafer W is cut into a chip size by using a dicing device 13. After the cutting, the dicing tape 11 is irradiated with ultraviolet rays so as to reduce the adhesive ability of the dicing tape 11, so that the cut chip can be taken.

EFFECT OF THE INVENTION

According to the present invention, when a substrate such as a semiconductor wafer is thinned, the substrate is supported by a supporting plate having rigidity instead of a tape. Consequently, handling or transfer can be automated. Also, when the substrate and the supporting plate are bonded, preliminary drying is conducted to an adhesive liquid which has been applied to a surface of the substrate, and thereby, it is possible to control the thickness of the adhesive layer and make the adhesion strength uniform.

Although the present embodiments of the invention have been discussed in detail, it will be understood that variations and modifications may be made thereto without departing from the spirit or scope of the invention as claimed.

What is claimed is:

1. A method for attaching a circuit-formed surface of a substrate including a semiconductor wafer to a supporting plate and for thinning the substrate, said method comprising the steps of:
    applying an adhesive liquid onto the circuit-formed surface of the substrate;
    conducting preliminary drying to the adhesive liquid so as to allow the adhesive liquid to maintain its shape as an adhesive layer;
    pushing the supporting plate onto the adhesive layer to unite the supporting plate and the adhesive layer;
    conducting further drying to the adhesive layer at the same time as the pushing step or after the pushing step; and
    thinning the substrate by grinding.

2. The method according to claim 1, wherein a novolac-type phenol resin is used for the adhesive liquid.

3. The method according to claim 1, wherein the supporting plate has a number of penetrating holes defined therethrough in the thickness direction, and the adhesive liquid is dried in the preliminary drying step until the adhesive will not leak through the penetrating holes in the pushing step.

4. The method according to claim 1, wherein the applying step and the preliminary drying step are repeated a plurality of times to increase thickness of the adhesive layer.

5. The method according to claim 1, wherein the temperature of the preliminary drying step is 200° C. or less, and the temperature of the further drying step is 300° C. or less.

6. The method according to claim 1, wherein the adhesive liquid is soluble with respect to alcohol or ketone.

7. The method according to claim 1, wherein after the applying step and before the preliminary drying step, a bead portion of the adhesive layer which has been formed on a periphery of the substrate is removed by a solvent.

8. The method according to claim 1, wherein an acrylic resin is used for the adhesive liquid.

9. The method according to claim 1, wherein the adhesive liquid is water insoluble.

10. A method for attaching a circuit-formed surface of a substrate including a semiconductor wafer to a supporting plate, before the substrate is thinned by grinding, comprising the steps of:
    applying an adhesive liquid onto the circuit-formed surface of the substrate;
    conducting preliminary drying to the adhesive liquid so as to allow the adhesive liquid to maintain its shape as an adhesive layer;
    pushing the supporting plate onto the adhesive layer to unite the supporting plate and the adhesive layer; and
    conducting further drying to the adhesive layer at the same time as the pushing step or after the pushing step;
    wherein the pushing step involves disposition of a sintered plate above said supporting plate and exhausting solvent of the adhesive layer through the sintered plate.

11. A method for attaching a circuit-formed surface of a substrate including a semiconductor wafer to a supporting plate, before the substrate is thinned by grinding, comprising the steps of:
    applying an adhesive liquid onto the circuit-formed surface of the substrate;
    conducting preliminary drying to the adhesive liquid so as to allow the adhesive liquid to maintain its shape as an adhesive layer;
    pushing the supporting plate onto the adhesive layer to unite the supporting plate and the adhesive layer; and
    conducting further drying to the adhesive layer at the same time as the pushing step or after the pushing step;
    wherein the pushing step involves disposition of a sintered plate above said supporting plate and exhausting solvent of the adhesive layer through the sintered plate; and
    wherein the supporting plate has a number of penetrating holes defined therethrough in the thickness direction, and the adhesive liquid is dried in the preliminary drying step until the adhesive will not leak through the penetrating holes in the pushing step.

* * * * *